United States Patent [19]

Blais

[11] 4,454,209
[45] Jun. 12, 1984

[54] HIGH RESOLUTION SOFT X-RAY OR ION BEAM LITHOGRAPHIC MASK

[75] Inventor: Phillip D. Blais, Washington Township, Fayette County, Pa.

[73] Assignee: Westinghouse Electric Corp., Pittsburgh, Pa.

[21] Appl. No.: 459,286

[22] Filed: Jan. 19, 1983

Related U.S. Application Data

[63] Continuation of Ser. No. 217,342, Dec. 17, 1980, abandoned.

[51] Int. Cl.$^3$ .......................... G03F 9/00; G03F 1/00
[52] U.S. Cl. .......................................... 430/5; 430/22; 430/966; 430/967
[58] Field of Search ...................... 430/5, 22, 966, 967

[56] References Cited

U.S. PATENT DOCUMENTS

| | | | |
|---|---|---|---|
| 3,742,230 | 6/1973 | Spears et al. | 430/5 |
| 3,963,489 | 6/1976 | Cho | 430/22 |
| 4,260,670 | 4/1981 | Burns | 430/967 |

OTHER PUBLICATIONS

Parrens, P., et al., *J. Vac. Sci. Tech.*, vol. 16(6), 11/1979, pp. 1965–1967.
Spiller et al., *Solid State Technology*, 4/1976, pp. 62–67.
Tischer, P., *Eurocon '80*, "Advances in X-ray Lithography", 3/1980, pp. 46–51.
Gordon, E., et al., *IEEE Transactions on Electron Devices*, vol. ED-221, No. 7, 7/1975, pp. 371–375.
Anon, *Electronics*, 10/17/77, pp. 134–136.
Maydan, et al., *IEEE Transactions on Electron Devices*, vol. ED, No. 7, 7/1975, pp. 429–433.
Anon, *Electronics*, 8/31/78, pp. 117–121.

*Primary Examiner*—Charles L. Bowers
*Attorney, Agent, or Firm*—J. B. Hinson

[57] ABSTRACT

A lithographic process utilizing soft x-rays or ions to achieve high resolution is disclosed. The process is particularly useful and semiconductor processing where high resolution is required to achieve a high density. The process utilizes a mask to selectively expose a photoresist to soft x-rays of flood beams of ions. The mask comprises a thin metallic foil supported by a frame such that the foil is in tension. The frame includes optical alignment keys. A second patterned layer of metal is affixed to the foil to form areas which are nontransparent to the soft x-rays or flood ion beams for delineating the elements of a semiconductor circuit, for example. This permits the mask to be optically aligned using conventionally techniques with high resolution being achieved due to the short wavelength of the x-ray radiation or the ion beams.

2 Claims, 7 Drawing Figures

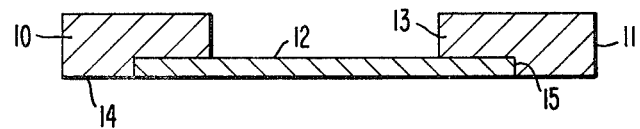
FIG.1
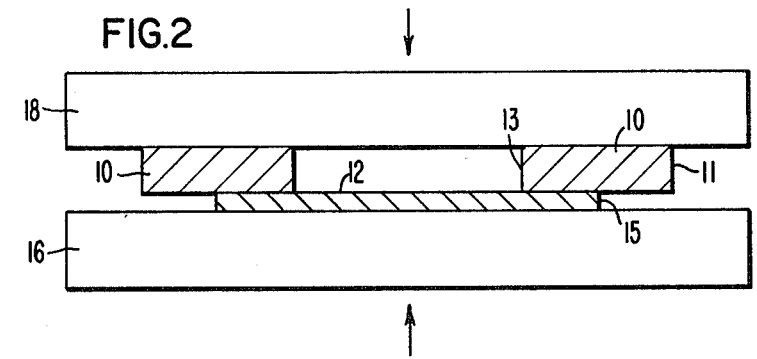
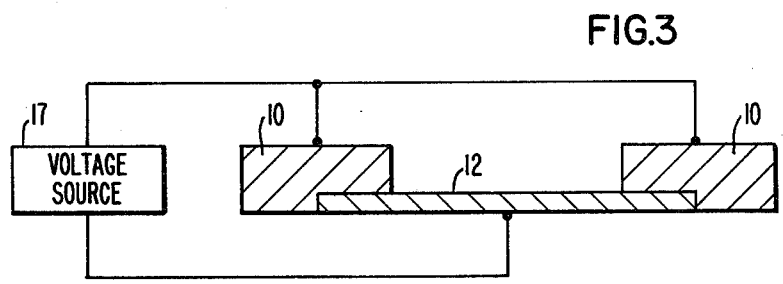
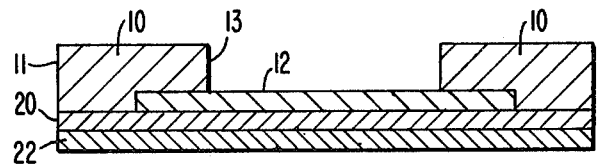
FIG.4

HIGH RESOLUTION SOFT X-RAY OR ION BEAM LITHOGRAPHIC MASK

This is a continuation of application Ser. No. 217,342, filed Dec. 17, 1980, abandoned.

BACKGROUND OF THE INVENTION

1. Field of the Invention

The invention relates to semiconductor processing and more specifically to high resolution lithographic processes using soft x-rays or ion beams.

2. Description of the Prior Art

One of the fundamental limitations of high density in semiconductor circuits has been the resolution of the litographic processes. Techniques currently offering the most promise of improving the resolution of lithography is either the so called electron beam writing, processes using flood beams of short wavelength radiation such as x-rays or flood beams of ions. Electron beam writing while providing high resolution is a relatively low production technique due to the time required for the beam writing process. X-ray and flood ion beam lithography has been difficult because the masks are fragile due to the fact that the preferred mask is a thin metal foil such as beryllium. In addition to the fragile nature of such mask, alignment has been difficult due to the fact that a preferred alignment technique is an optical process (i.e., using visible light) and the metallic foil mask is non-transparent in the visible range.

SUMMARY OF THE INVENTION

The invention provides a high resolution lithographic process which utilizes a mask which can be aligned using conventional optical techniques. The mask and short wavelength radiation, such as soft x-rays or ion beams, are used to selectively expose resist layers to form patterned protective layers.

The mask includes a support frame which is transparent to visible light with patterns affixed thereto to form optical alignment keys. A foil, preferably of metal, and transparent to soft x-rays or ions is affixed to the lead frame and held in tension thereby. A patterned layer, preferably of a second metal, is affixed to the foil to render selected areas of the foil nontransparent to soft x-rays or ions. In practicing the disclosed lithographic process, the mask is utilizied to selectively expose resist layers whose chemical structure can be changed in response to exposure to soft x-rays or to ion beams. Following exposure, the resist layers are developed to produce a patterned protective layer to be used in the lithographic process.

DESCRIPTION OF THE DRAWINGS

FIG. 1 is a cross section of the support mask frame and the foil bonded thereto.

FIG. 2 is a drawing illustrating how the flat surface comprising portions of the support frame and the foil is formed.

FIG. 3 is a drawing illustrating the process for bonding the foil to the support frame.

FIG. 4 is a cross section drawing of the support frame and the foil bonded thereto with thin overlying layers of a metal and photoresist.

DETAIL DESCRIPTION

Figure 5:
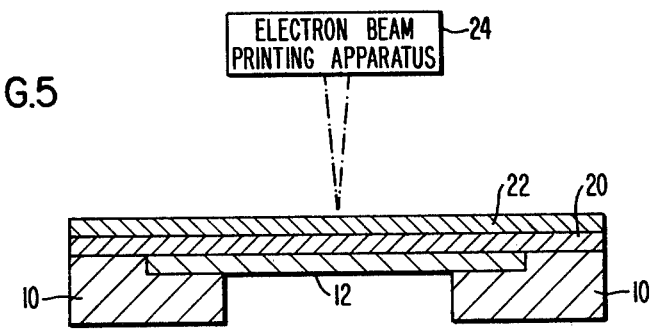
FIG. 5 is a drawing illustrating the electron beam write-in process utilized to form the mask.

FIG. 1 is a cross sectional drawing illustrating the support frame 10 and the thin metallic foil 12, preferably beryllium having a thickness in the order of 25 microns, bonded thereto. In the preferred embodiment, the outer and inner perimeters, 11 and 13, of the support frame may be circular, rectangular or any other convenient shape. Since the support frame 10 is glass, it is not normally transparent to soft x-rays. This limits the useful area for forming masking patterns useful in soft x-ray lithographic techniques to the window formed by the inner perimeter 13 of the support frame 10. Areas of the support frame 10 extending beyond the outer perimeter 15 of the foil 12 are utilized to form keys for aligning the mask using visible light.

A substantially flat common under surface 14 is formed by the surface of the foil 12 and the support frame 10. The foil 12 is bonded to the support frame 10 under conditions which assure that the foil 12 will always be under tension in all directions thus assuring a stable flat surface for the foil 12.

FIG. 2 illustrates the first step in the process for bonding the foil 12 to the support frame 10. A first substantially flat plate 16, of stainless steel for example, is used to support the foil 12. The glass support frame 10 is positioned such that the inner edge 13 of the support frame 10 overlaps the outer edge 15 of the foil 12. A second flat plate 18 is positioned in overlying relationship with the glass support frame 10. Pressure is applied to the two plates 16 and 18 and the whole structure is heated to the softening point of the glass support frame 10. Under these conditions the glass support frame 10 will be deformed such that the bottom edges of the glass support frame 10 become substantially flat with the bottom surface of the foil 12. This produces the substantially flat bottom surface as illustrated in FIG. 1 and previously discussed.

FIG. 3 functionally illustrates the process by which the foil 12 is bonded to the glass member 10. Basically, the foil 12 is electrically conductive because it is preferably a metal such as beryllium. Heating the glass frame 10 to the point where it becomes plastic also causes this member to become slightly electrically conductive. A voltage source 17 of sufficient magnitude is coupled to apply a voltage between the foil 12 and the frame member 10 to cause an electric current to flow between these two members. Bonding time is a function of temperature and current flow. This bonding process is known in the art and fully discussed in U.S. Pat. No. 3,397,278 issued to D. I. Pomerantz. For purposes of illustrating how the glass to metal bond is made, U.S. Pat. No. 3,397,278 is incorporated by reference.

The bonded operation described above will take place normally in a temperature range in from 300° to 800° C. depending upon the glass selected for the support frame 10. Also the glass member 10 will generally have a slightly lower coefficient of expansion than the metallic foil 12. When the bonded operation has been complete and the frame member 10 and the foil 12 are cooled the foil 12 will be under tension assuring that the common surface 14 of the class support frame 14 and the foil 12 will be substantially flat, as discussed above and illustrated in FIG. 1.

After the support frame 10 and the foil 12 have cooled, the bottom surface including the support frame 10 and the foil 12 are coated with a thin layer of gold 20, preferably having a thickness in the range of ½ to 1 micron. To facilitate adhesion of the gold layer 20 the bottom surface of the glass support frame 10 and the beryllium layer 12 may be first covered with a very very thin layer of titanium for example. On the surface of the gold layer 20 a thin layer of photoresist 22 is deposited.

Electron beam apparatus functionally illustrated at reference numeral 24 is utilized to selectively expose the photoresist 22. The pattern to be utilized for X-ray photolithographic purposes is confined to an area within the window formed by the inner perimeter 13 of the support frame 10 because the glass support frame will not normally be transparent to the soft x-rays. The regions overlying the edges of the support frame 10 which extend beyond the edge of the foil 12 are utilized to form optical alignment keys which are utilized to align the mask using standard techniques and visible light. The electron beam write-in apparatus 24 can be controlled in a conventional manner to produce the desired pattern for the lithographic processes as well as the alignment keys.

Following electron beam writing, the photoresist layer 22 is developed using conventional processes and the gold layer 20 is etched to produce a pattern for lithographic processes within the window defined by the inner perimeter 13 of the support frame 10 and optical alignment keys in the portions extending beyond the outer perimeter 15 of the foil 12. The finish mask is illustrated in FIG. 6.

The gold images can also be formed using rejection or plating processes. In all cases, the technology for forming the gold images is well known in the art.

Figure 6:
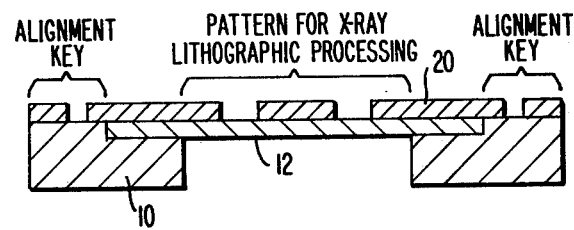
FIG. 6 is a cross section view of the final mask.
Figure 7:
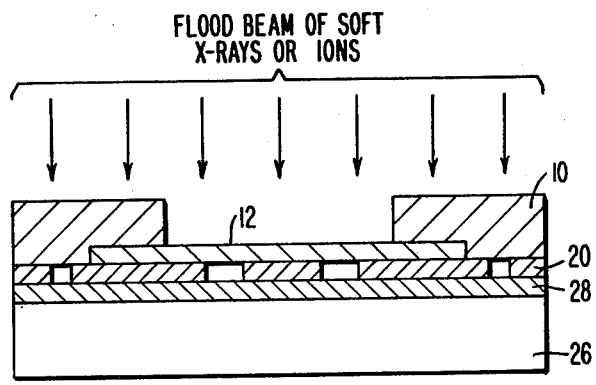
FIG. 7 is a drawing illustrating the photolithographic process.

The mask illustrated in FIG. 6 is particularly useful in x-ray or flood beam ion lithographic process in of semiconductor wafers. A typical photolithographic process is functionally illustrated in FIG. 7. A semiconductor substrate is coated with a thin layer of photoresist 28 using conventional process in techniques. The mask is then positioned such that the gold pattern layer 20 is in close proximity or actually touching the photoresist layer 28. The alignment keys and the edges of the mask are utilized to properly align the mask with respect to the substrate 26 using well-known optical alignment techniques. Following alignment, a flood beam of soft x-rays or ions is directed to impinge on the upper surface of the mask. The soft x-rays or ions will not penetrate the glass forming in the support frame 10 or the portions of the metallic foil 12 which are overlaid by the patterned gold layer 20. However, in regions where there are openings in the gold patterned layer 20 which are within the inner perimeter 13 of the support frame 10, the soft x-rays or ions will penetrate the foil 12 and impinge upon the photoresist layer 28. The chemical structure of the photoresist layer 28 is modified by the x-rays or the ions. The photoresist layer 28 is then developed and processed to use in conventional processing.

In the above-described process, soft x-rays and ions are utilized because currently available resists are not suitable for use with hard x-rays. It should also be noted that in photolithographic processing of semiconductor wafers that alignment is only critical during the second and subsequent photolithographic processing steps. Thus, the first mask should be designed such that the inner perimeter 13 of the support frame 10 is larger than the active area of the circuit. During the first processing step, alignment patterns must be produced for aligning with the alignment keys. Thus, it is obvious that the mask described above is the type for use with the second and subsequent processing steps because it includes alignment keys in the portions of the support frame 10 which extend beyond the perimeter 15 of the foil 12.

What we claim is:

1. A mask for use in lithographic processing, comprising in combination:
   (a) a glass support frame transparent to visible light and non-transparent to short wave-length radiation;
   (b) a beryllium foil non-transparent to visible light and transparent to said short wave-length radiation, said foil being affixed to said support frame such that said support frame extends beyond the perimeter of said foil with said foil and said portions of said support frame which extend beyond the perimeter of said foil joining to form a substantially flat surface; and
   (c) a thin patterned layer affixed to said substantially flat surface rendering portions of said beryllium foil and said support frame overlaid by said patterned layer non-transparent to visible light and to radiation within said selected band with portions of said support frame in conjunction with portions of said patterned layer forming a key for aligning said mask permitting said mask to be aligned using visible light.

2. A mask in accordance with claim 1 wherein said beryllium is always in tension, said tension being established by bonding said beryllium foil to said glass from at a temperature above 200° C.

* * * * *